United States Patent
Yuan et al.

(10) Patent No.: US 11,692,263 B2
(45) Date of Patent: Jul. 4, 2023

(54) COATING CONTROL USING FORWARD PARAMETER CORRECTION AND ADAPTED REVERSE ENGINEERING

(71) Applicant: VIAVI Solutions Inc., San Jose, CA (US)

(72) Inventors: Zhao Yuan, Jiangsu (CN); Markus K. Tilsch, Santa Rosa, CA (US); Georg J. Ockenfuss, Santa Rosa, CA (US); Marius Grigonis, Santa Rosa, CA (US); Andrew Clark, Santa Rosa, CA (US); Donggong Peng, Jiangsu (CN); Yinxiang Xia, Jiangsu (CN); Eric Nybank, Aptos, CA (US); Neil Pinkerton, Santa Rosa, CA (US)

(73) Assignee: VIAVI Solutions Inc., Chandler, AZ (US)

( * ) Notice: Subject to any disclaimer, the term of this patent is extended or adjusted under 35 U.S.C. 154(b) by 0 days.

(21) Appl. No.: 16/619,840

(22) PCT Filed: Sep. 28, 2018

(86) PCT No.: PCT/CN2018/108297
§ 371 (c)(1),
(2) Date: Dec. 5, 2019

(87) PCT Pub. No.: WO2020/062016
PCT Pub. Date: Apr. 2, 2020

(65) Prior Publication Data
US 2021/0332474 A1    Oct. 28, 2021

(51) Int. Cl.
*H01J 37/34*    (2006.01)
*C23C 14/54*    (2006.01)
(Continued)

(52) U.S. Cl.
CPC ........ *C23C 14/547* (2013.01); *C23C 14/0042* (2013.01); *C23C 14/35* (2013.01);
(Continued)

(58) Field of Classification Search
CPC ....... C23C 14/52; C23C 14/54; C23C 14/545; C23C 14/546; C23C 14/547; H01J 37/3464; H01J 37/3476
See application file for complete search history.

(56) References Cited

U.S. PATENT DOCUMENTS 5,772,861 A    6/1998  Meredith, Jr. et al.
5,911,856 A    6/1999  Suzuki et al.
(Continued)

FOREIGN PATENT DOCUMENTS

CN    101265568 A    9/2008
CN    102191475 A    9/2011
(Continued)

OTHER PUBLICATIONS

Jun. 19, 2019 International Search Report and Written Opinion issued in PCT/CN2018/108297, 9 pages.
(Continued)

*Primary Examiner* — Michael A Band
(74) *Attorney, Agent, or Firm* — Harrity & Harrity, LLP

(57) ABSTRACT

A device may include one or more memories and one or more processors, communicatively coupled to the one or more memories, to receive design information, wherein the design information identifies desired values for a set of layers of an optical element to be generated during one or more runs; receive or obtain historic information identifying a relationship between a parameter for the one or more runs and an observed value relating to the one or more runs or the optical element; determine layer information for the one or more runs based on the historic information, wherein the
(Continued)

layer information identifies run parameters, for the set of layers, to achieve the desired values; and cause the one or more runs to be performed based on the layer information.

16 Claims, 7 Drawing Sheets

(51) Int. Cl.
*C23C 14/35* (2006.01)
*C23C 14/00* (2006.01)
*C23C 14/52* (2006.01)

(52) U.S. Cl.
CPC .............. *C23C 14/52* (2013.01); *C23C 14/54* (2013.01); *H01J 37/3464* (2013.01); *H01J 37/3476* (2013.01)

(56) References Cited

U.S. PATENT DOCUMENTS

| | | | |
|---|---|---|---|
| 6,217,720 B1 | 4/2001 | Sullivan et al. | |
| 6,556,947 B1 | 4/2003 | Scheiner et al. | |
| 6,964,876 B2 | 11/2005 | Heuken | |
| 7,324,865 B1 | 1/2008 | Sonderman et al. | |
| 8,864,958 B2 * | 10/2014 | Tilsch .................... | C23C 14/34 204/298.26 |
| 2006/0196765 A1 | 9/2006 | Cheng et al. | |
| 2008/0223714 A1 | 9/2008 | Tilsch et al. | |
| 2015/0371847 A1 | 12/2015 | Cheng et al. | |

FOREIGN PATENT DOCUMENTS

| | | |
|---|---|---|
| CN | 102912306 A | 2/2013 |
| CN | 103540906 A | 1/2014 |
| JP | 2002107763 A | 4/2002 |
| JP | 2002294444 A | 10/2002 |
| JP | 2004151492 A | 5/2004 |
| JP | 2007072307 A | 3/2007 |
| JP | 2007321170 A | 12/2007 |
| JP | 2008223140 A | 9/2008 |
| JP | 2016125108 A | 7/2016 |
| JP | 2017064392 A | 4/2017 |
| WO | 0190434 A2 | 11/2001 |

OTHER PUBLICATIONS

Castillo et al., "Run-to-run Process Control: Literature Review and Extensions," Journal of Quality Technology, Apr. 1997, vol. 29(2), pp. 184-196. [Retrived from DOI: 10.1080/00224065.1997. 11979749, [retrieved on Feb. 21, 2018].

Chen et al., "Run-by-Run Process Control of Metal Sputter Deposition: Combining Time Series and Extended Kalman Filter," IEEE Transactions on Semiconductor Manufacturing, IEEE Service Center, Aug. 2007, vol. 20(3), XP011189510, ISSN: 0894-6507, pp. 278-285. DOI: 10.1109/TSM.2007.901392.

Extended European Search Report for Application No. 18935654.6, dated Sep. 3, 2021, 67 pages.

Gillet et al., "Run-to-Run Control of DC-Sputtering Processes," Proceedings of the American Control Conference, Jan. 2021, vol. 3, pp. 1997-2002. [Retrieved from the Internet: URL:https://doi.org/10.1109/ACC.2001.946035?nosfx=y].

Khan et al., "Run-to-Run Control of ITO Deposition Process," SID International Symposium. May 1998, XP007008749, 4 pages.

Sullivan et al., "Depostion Error Compensation for Optical Multilayer Coatings Ii. Experimental Results Sputtering System," Applied Optics, Optical Society of America, May 1993, vol. 32(13), pp. 2351-2360. DOI: 10.1364/A0.32.002351.

* cited by examiner

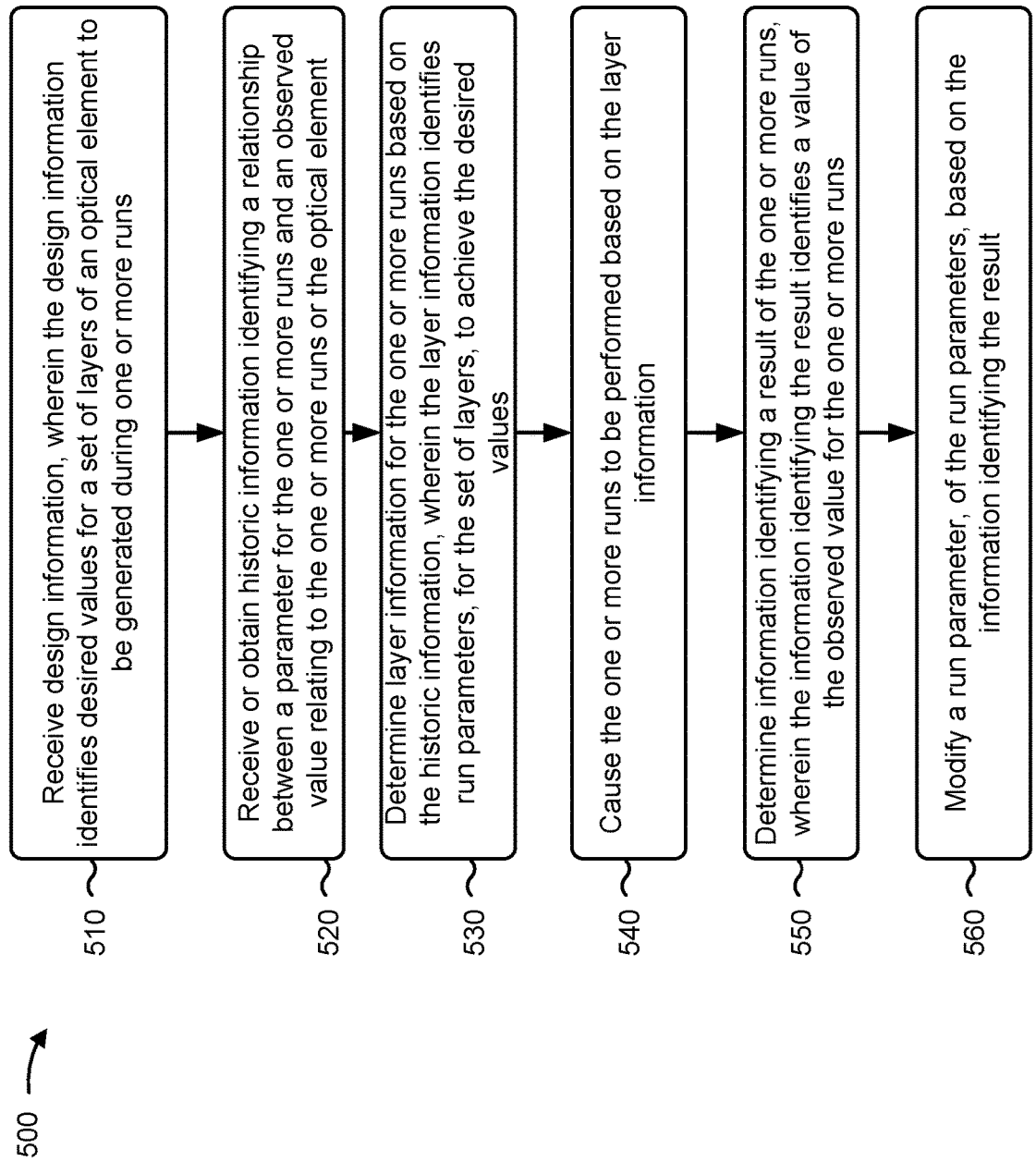

COATING CONTROL USING FORWARD PARAMETER CORRECTION AND ADAPTED REVERSE ENGINEERING

CROSS-REFERENCE TO RELATED APPLICATION

This application is a 371 national stage of PCT Application No. PCT/CN2018/108297 filed on Sep. 28, 2018, entitled "COATING CONTROL USING FORWARD PARAMETER CORRECTION AND ADAPTED REVERSE ENGINEERING," which is hereby expressly incorporated by reference herein.

BACKGROUND

A coating system may be used to coat a substrate with a particular material. For example, a sputtering system may be used for deposition of thin film layers, thick film layers, and/or the like. Based on depositing a set of layers, an optical element may be formed. For example, a thin film may be used to form a filter, such as an optical interference filter.

SUMMARY

According to some implementations, a device may include one or more memories and one or more processors, communicatively coupled to the one or more memories, to receive design information, wherein the design information identifies desired values for a set of layers of an optical element to be generated during one or more runs; receive or obtain historic information identifying a relationship between a parameter for the one or more runs and an observed value relating to the one or more runs or the optical element; determine layer information for the one or more runs based on the historic information, wherein the layer information identifies run parameters, for the set of layers, to achieve the desired values; and cause the one or more runs to be performed based on the layer information.

According to some implementations, a method may include receiving, by a coating control device, design information, wherein the design information identifies desired values for a set of layers of an optical element to be generated during one or more runs; receiving or obtaining, by the coating control device, historic information identifying a relationship between a parameter for the one or more runs and an observed value relating to the one or more runs or the optical element; determining, by the coating control device, layer information for the one or more runs based on the historic information, wherein the layer information identifies run parameters, for the set of layers, to achieve the desired values; causing, by the coating control device, the one or more runs to be performed based on the layer information; determining, by the coating control device, information identifying a result of the one or more runs, wherein the information identifying the result identifies a value of the observed value for the one or more runs; and modifying, by the coating control device, a run parameter, of the run parameters, based on the information identifying the result.

According to some implementations, a non-transitory computer-readable medium may store one or more instructions that, when executed by one or more processors, cause the one or more processors to receive design information, wherein the design information identifies desired values for a set of layers of an optical element to be generated during one or more runs; receive or obtain historic information identifying a relationship between a parameter for the one or more runs and an observed value relating to the one or more runs or the optical element; determine layer information for the one or more runs based on the historic information, wherein the layer information identifies run parameters, for the set of layers, to achieve the desired values; and cause the one or more runs to be performed based on the layer information.

BRIEF DESCRIPTION OF THE DRAWINGS

FIG. 5 is a flow chart of an example process for coating control using forward parameter correction and enhanced reverse engineering based on expected deterministic process parameter drifts.

DETAILED DESCRIPTION

Figure 1:
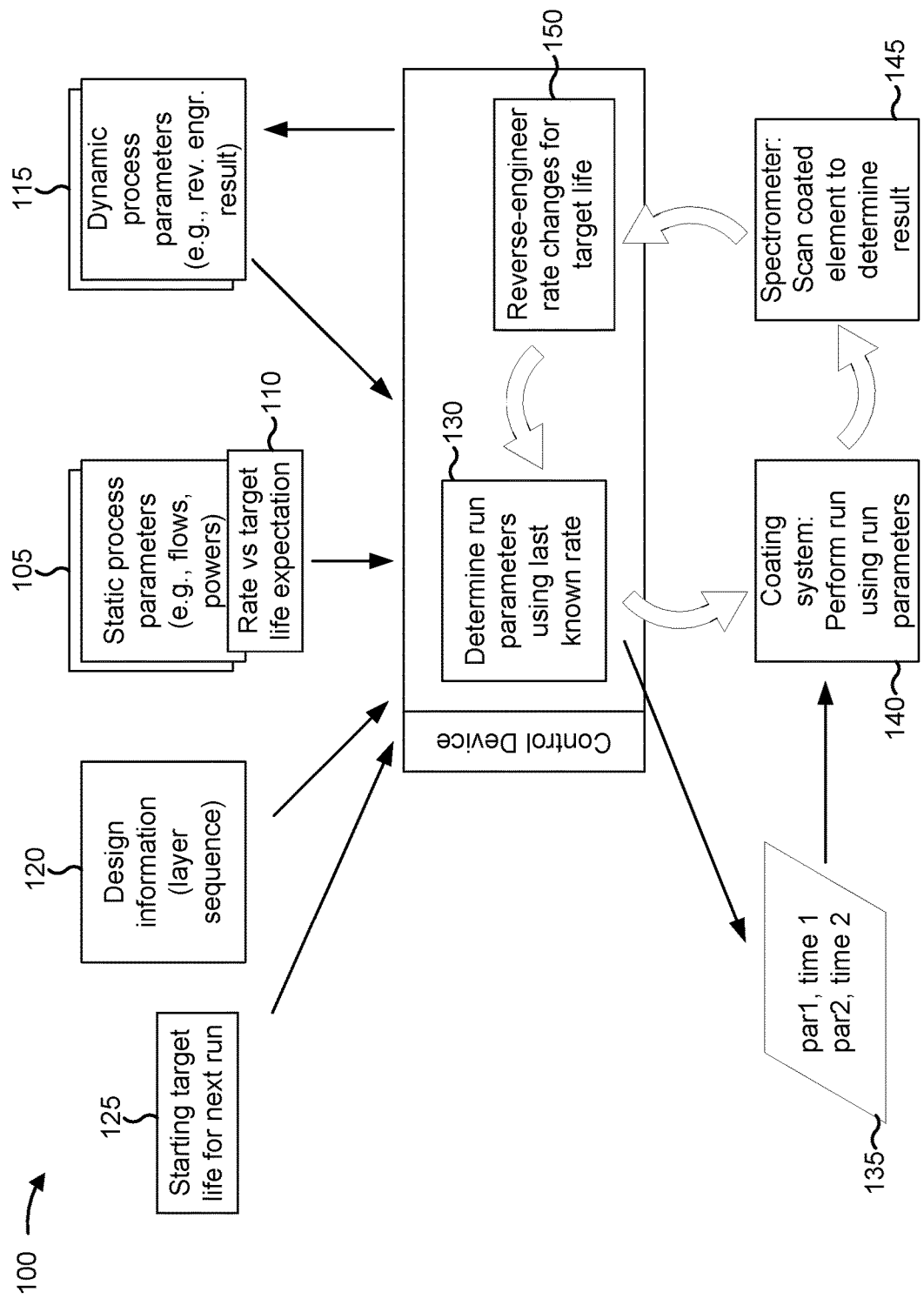
FIG. 1 is a diagram of an example implementation for coating control using forward parameter correction and enhanced reverse engineering based on expected deterministic process parameter drifts.

The following detailed description of example implementations refers to the accompanying drawings. The same reference numbers in different drawings may identify the same or similar elements.

A coating system may deposit material from a target onto a substrate to form an element, such as an optical element (e.g., an interference filter, a bandpass filter, etc.). For example, the coating system may perform sputtering of the target over a coating run (referred to herein as a "run") in which layers of material are deposited on the substrate. A series of runs to create a set of elements may be referred to herein as a campaign. In some cases, multiple targets are used. A campaign may extend for up to the life of the target or targets.

The coating system may perform a run based on various run parameters, such as gas flow rate, power supply setpoint, a time length of the run, and/or the like. Some parameters are static parameters, which may be static from run to run. Some parameters may be dynamic, and may be configurable from run to run. These run parameters may be configurable with the goal of achieving a desired coating thickness of multiple layers for each run. Thus, a coating rate may be observed based on the time length of the run and the coating thickness deposited during the run. In some cases, the coating system may determine a result of a run that is not directly observed using the coating thickness. For example, certain spectral measurements may provide information about the result of the run.

It should be noted that many runs use multiple layers of two or more materials, so implementations described herein may use multiple coating rates and many coating thicknesses, as described in more detail elsewhere herein. In some cases, a single coating rate is described herein for brevity or clarity. It is to be understood that where a single coating rate is described, multiple coating rates are also contemplated.

The coating system may adjust run parameters to achieve a desired value (e.g., coating thickness or another value) for each run. For example, a control device may adjust the parameters from run to run so that the runs satisfy goals with regard to spectral performance, refractive index, bandwidth, layer thickness, and/or the like. Ideally, a coating system would have a perfectly stable coating rate and a stable coating chamber, leading to exactly predictable coating thicknesses. For example, when certain run parameters are applied, an ideal coating system would have a predictable and stable coating thickness for each run, meaning that a stable coating rate is achieved. However, in practice, coating rates are not perfectly stable. For example, environmental conditions (e.g., water content in the coating chamber, temperature), change in the target over time (e.g., a geometry of the target at an end of a campaign in comparison to a beginning of the campaign), stray coating building up on shields of the coating system, and/or the like, may cause the coating rate or coating rates to drift from expected values over time.

One approach for handling a drifting coating rate is to perform a measurement for an element after a run is performed, determine a result of the run based on the measurement, and derive run parameters for a next run using the result. In some cases, this may be referred to as "reverse engineering." For example, the result may include a spectral response that indicates a thickness of the optical element, and the coating system may adjust a run parameter for the next run (e.g., a time length and/or the like) according to a difference between the observed thickness and a desired value.

In some cases, reverse engineering may be performed for two consecutive runs. This may improve accuracy of the run parameters (and therefore, hopefully, the corresponding coating rate), but may take significant time and reduce utilization of the coating system. In some cases, reverse engineering may be performed in a staggered fashion, wherein run parameters for a third run are determined based on a parameter and observed value for a first run while a second run is performed, run parameters for a fourth run are determined based on a parameter and observed value for a second run while the third run is performed, and so on. This technique may be referred to as "leapfrogging." Leapfrogging may improve utilization of the coating system, thereby increasing throughput.

However, reverse engineering and leapfrogging may present challenges over the length of a campaign. For example, the coating rate may not be fixed over the life of a target due to changing geometry of the target, changing conditions in the coating chamber, and/or other factors. Furthermore, leapfrogging may increase the length of time between a run for which a result is determined and a run for which run parameters are determined based on the result, which increases a likelihood that the later run is inaccurate with regard to a desired value, particularly considering the drift in the coating rate described above. In some cases, the coating system may need to halt the campaign and perform a calibration coating to determine an observed coating thickness or coating rate, which further decreases throughput and utilization. For a more detailed description of coating rate accuracy in view of reverse engineering and leapfrogging, refer to FIG. 4A, below.

Some implementations described herein may provide for coating thickness and/or rate control using forward parameter correction and enhanced reverse engineering based on expected deterministic process parameter drifts. For example, the change in a parameter, such as coating rate, may have a relationship with an observed value, such as a coating target life. As used herein, a coating target life (sometimes referred to as a coating target's life, the life of a coating target, a target life, the life of a target, and/or the like) may refer to a measure of total usage of a target. In some cases, a coating target life may be expressed as a function of power and time (e.g., if a power of 15 kW is applied to a target for 600 seconds, the coating target life of the target may increase by 2.5 kWh (15 kW*600 s/3600 s/h)), although other expressions of coating target life are possible and contemplated herein. In some implementations, coating target life may be tracked by a control device and/or the like.

In this example, as the coating target's life elapses, the coating rate may drift or change in a particular (e.g., predictable) fashion. Some implementations described herein may use a relationship between a parameter and an observed value to determine run parameters for a run of the coating system. For example, this may allow implementations described herein to adjust run parameters as runs are performed to keep the runs accurate with regard to a desired value in view of a changing parameter, such as coating rate.

Some implementations described herein also provide enhanced reverse engineering, particularly for linked reverse engineering. Linked reverse engineering may be used when two or more processes are performed (e.g., two or more materials are sputtered from one or more targets). In such a case, when a spectral response does not provide useful feedback regarding both processes, a linked relationship between the two processes is assumed so that feedback regarding one process is used to determine parameter adjustments for both processes. This may be performed in some legacy implementations assuming a 1:1 link between the two or more processes, which may or may not be accurate in practice, and which may become less accurate over time when the two or more processes are associated with different rates of drift with regard to one or more parameters.

Some implementations described herein determine the link between two or more processes based on respective relationships (e.g., rates of change of coating rates in comparison to target life, or other configurations described herein) of the two or more processes. For example, if one process changes twice as quickly as another process over the life of a target, a 1:2 relationship between these processes may be used to perform reverse engineering. Thus, accuracy of reverse engineering for such processes is improved in comparison to assuming a 1:1 link between the processes.

In this way, accuracy of coating rates may be improved based on expected deterministic process parameter drifts, which enables more frequent and consistent use of leapfrogging, reduces the rate of unacceptable process outputs, and reduces reliance on calibration runs.

Some implementations described herein use the coating target life and/or a point in the coating target life as an observed value for determining the run parameters. However, other observed values, other than coating target life, may be used and are contemplated herein. For example, if the coating system performs runs in a predictable or regimented fashion, time or elapsed time may be used in place of coating target life. Similarly, if coating is performed repeatedly for the same or similar products, a sequential batch number or run number may be used in place of coating target life. In other words, coating target life is one of many possible values that may be used to quantify coating rate drift over time/target life/batch sequence. It is to be understood that "coating target life" can refer to any of the values described in this paragraph. Furthermore, some observed values are not based on a time parameter. For example, a spectral measurement, refractive index, or absorption index may be used as an observed value.

FIG. 1 is a diagram of an example implementation 100 for coating control using forward parameter correction and enhanced reverse engineering based on expected deterministic process parameter drifts. More particularly, FIG. 1 shows a control loop for coating thickness control based on forward parameter correction, based on enhanced reverse engineering, using a run time as an adjustable parameter based on spectral observations regarding an optical element.

FIG. 1 shows various inputs of information to a control device, which are shown by reference numbers 105, 110, 115, 120, and 125. Furthermore, FIG. 1 shows a determination, by the control device, of run parameters for a coating process (e.g., reference number 130) based on forward parameter correction. The run parameters are shown by reference number 135. A coating system (or the control device) may perform a run based on the run parameters (shown by reference number 140), and a spectrometer may perform a scan of the element generated by the run to determine a result (shown by reference number 145). As shown by reference number 150, the control device may receive information based on the scan (e.g., information identifying the result). The control device may perform reverse engineering based on the result, and may modify the run parameters for a later run based on the reverse engineering (shown by the cyclical arrows in FIG. 1). A more detailed description of each of the above inputs and operations is provided below.

As shown by reference number 105, the control device may receive or determine information regarding static process parameters for a coating process. A static process parameter may include a parameter that is statically or semi-statically configured, that is unlikely to change in the course of a run or a campaign, and/or the like. Examples of a static process parameter include an argon gas flow value, a power supply operation mode, and/or the like. It should be noted that a particular parameter may be static in some cases and dynamic in other cases. For example, a gas flow rate may be held steady in some cases (e.g., when run time is to be varied between runs to achieve a desired thickness) and may be variable in other cases (e.g., when the observed value for reverse engineering is a refractive index or absorption index related to the gas flow rate).

As shown by reference number 110, the control device may receive or determine historic information identifying a relationship between a coating rate and a coating target life. More generally, the control device may receive historic information identifying a relationship between a parameter and an observed value. The historic information may identify (or may enable the control device to identify) a coating rate to be expected at a particular point in a coating target's life for given parameters. For example, an observed coating rate may change or drift over the course of a coating target life span.

In some implementations, described herein, the control device may use a non-linear relationship to define the relationship between the parameter and the observed value. For example, the control device may use a second-order or higher-order function or polynomial to define the relationship between the parameter and the observed value. In some aspects, the control device may receive or store information identifying values for the relationship between the coating rate and the coating target life. For example, the control device may store a lookup table or a similar data structure that identifies coating rates corresponding to different coating target life values. In some aspects, the control device may use a linear relationship between the parameter and the observed value.

The relationship between the parameter and the observed value may be shown as a static parameter because the relationship may be a predetermined value. For example, in this case, the relationship may be determined based on observations regarding past campaigns. In some implementations, the relationship may be adjusted based on reverse engineering. For example, if the control device determines that a result of a run has drifted from an expected value associated with the relationship using reverse engineering, the control device may adjust the relationship to improve the accuracy of future runs.

In some implementations, two or more materials may be produced by the same target. For example, in some cases, SiO2, Si, Si3N4, and SiOx may all be produced from one target. In such a case, a single target can have multiple processes. The target life counter for the single target may be shared between all processes. For example, if the coating system coats SiO2, the target may be partially depleted and the target life counter may increment. Then, a subsequent Si layer from the same target will start with a rate assumption of this higher (e.g., more advanced, more depleted, incremented) target life. Thus, multi-process target depletion may be taken into account when performing reverse engineering.

In some implementations, the information identifying the relationship may relate to multiple, different targets, such as in a case wherein a substrate is to be coated with material from the multiple, different targets. For example, each target may be associated with a respective function that defines the relationship between the coating rate for each target and the respective coating target lifespan of each target. The control device may determine parameters for the coating rate based on the respective functions. This may improve accuracy of coating in comparison to determining parameters for multiple targets based on an assumption that the coating rates of the multiple targets are linked (e.g., based on a constant relationship and/or the like).

As shown by reference number 115, the control device may receive or determine one or more dynamic process parameters. A dynamic process parameter may include a value (e.g., a run parameter) that can be changed from one run to another (e.g., based on reverse engineering and/or a static process parameter, such as a relationship between a parameter and an observed value). In some implementations, the control device may determine an observed coating thickness or rate for a particular run (e.g., using a spectroscopic measurement and a reverse engineering technique), may store the observed coating thickness or rate and information identifying a target life associated with the observed coating thickness or rate, and may use the stored information to determine a parameter for a later run. For example, the control device may adjust a run parameter based on whether the observed coating thickness or rate matches an expected coating rate (e.g., based on a machine learning technique and/or the like). In this way, the control device iteratively adjusts coating rate parameters based on observed coating thicknesses or rates, which further improves accuracy of the coating rate determination.

The control device is described herein as determining an observed coating thickness or rate. However, in some cases, the control device may determine another parameter that is associated with the coating thickness or rate. For example, the control device may determine whether a spectral response of the optical element matches a spectral response associated with a desired coating thickness. Thus, direct measurement of the coating thickness need not be performed, which may reduce reliance on expensive and complex measurement techniques, thereby increasing throughput.

As shown by reference number 120, the control device may receive design information identifying a layer sequence. For example, a run may include the deposition of one or more layers on a substrate. Each layer may have a desired material thickness. The control device may receive design information identifying layers (e.g., materials from which each layer is to be formed, an order or sequence of the layers, etc.) and a thickness to be achieved for each layer. The control device may use this information to determine run parameters for runs to deposit the layers on the substrate, as described in more detail below.

As shown by reference number 125, the control device may receive or determine information identifying a starting target life value for a next run. For example, a target may be depleted as successive runs are performed. The target may start at a particular target life value (e.g., which may be expressed in kilowatt-hours (kWh), a time value, and/or the like) before a first run is performed. Each run may deplete material from the target. The control device may determine a starting target life of each target for each run to be performed. The control device may use the starting target life to determine run parameters for each run (e.g., based on the information identifying the relationship between the parameter and the observed value, as described in more detail below).

As shown by reference number 130, the control device may determine run parameters for a run. For example, the control device may determine the parameters using a last known coating rate for all layers associated with the run (e.g., using the relationship shown by reference number 110 and a reverse engineering result, described below). In some implementations, a run parameter may include a run time. For example, the run parameter may identify a length of time for which deposition or sputtering is to be performed with regard to a particular target or layer.

In some implementations, the control device may determine a run parameter for a layer based on the starting target life for the layer (shown by reference number 125), a thickness of the layer (shown by reference number 120), a reverse-engineered result for the layer or another dynamic process parameter (shown by reference number 115), and a target life for the run from which the reverse-engineered coating rate was determined (also shown by reference number 115). For example, the control device may determine a run time for the layer using the reverse-engineered coating rate, adjusted based on the difference between the target life for the run from which the reverse-engineered coating rate was determined and the starting target life for the layer. The control device may adjust the reverse-engineered coating rate based on a relationship between the coating rate and the target life (as shown by reference number 110).

The control device may use the adjusted coating rate and the material thickness to determine run parameters for the layer (shown by reference number 135). Here, parameters are shown as par1 and par2, and the run time for each layer is shown as time 1 and time 2. For example, when the adjusted coating rate indicates that a previous run was thinner than a desired value, the control device may lengthen time 1 and/or time 2. As another example, when the adjusted coating rate indicates that a previous run was thicker than a desired value, the control device may shorten time 1 and/or time 2. In this way, the control device determines the run parameters for the layer using a reverse-engineered coating rate that is adjusted based on the relationship between the coating rate and the target life, and using a starting target life for the layer, which improves accuracy of the parameter and reduces effects of changing target geometry and/or the like. In some implementations, the control device may perform the above operations for each layer in a run (e.g., with regard to each target to be deposited in a run) using information specific to each layer and each target.

In some implementations, the control device may determine a run parameter other than, or in addition to, a run time. As one example, the control device may determine a power supply setpoint based on an observed value (e.g., a coating thickness, a coating rate, or a target life. The power supply setpoint may allow the control device to increase or decrease a coating rate, which may enable the control device to hold a coating rate steady over the life of a sample. As a second example, the control device may determine a bias based on an observed value. The bias may be a measure of starting or ending delays in a run that may affect thickness of layers. For example, a layer time may be based on the relationship: (target thickness+bias)/coating rate.

As a third example, the control device may determine a rotary drive height. The rotary drive height may permit the control device to regulate runoff across the substrate. For example, if there is more distance between the target and the substrate, the coating rate at a center of the rotary drive may be higher than the coating rate at an edge of the rotary drive. In this case, the control device may perform reverse engineering based on multiple spectral measurements at different locations on the optical element. This may enable the use of multiple, different rates to perform enhanced reverse engineering. For example, the control device may track respective changes in the multiple spectral measurements, and may use a relationship between the respective changes to determine a rotary drive height for a future run.

In some implementations, the control device may determine a geometric relationship between a target or source and the substrate. For example, the rotary drive height may be one such geometric relationship. The geometric relationship may affect coating rate, runoff, and/or the like. Other examples of configuring the geometric relationship include raising or lowering the target, moving or translating a component in a spatial direction, modifying the geometry or location of a mask, and/or the like.

In some implementations, the control device may determine a gas flow rate (e.g., an oxygen flow rate and/or the like). For example, a gas flow rate may affect a coating rate and/or a desired material property (e.g., refractive index, absorption, etc.). In some implementations, the control device may determine the above parameters based on measurements performed with regard to one or more layers or runs, as described in connection with reference number 150, below.

In some implementations, the control device may iteratively determine values for one of the above run parameters using a control loop similar to the one described herein for the coating rate. For example, the control device may determine parameter values by analyzing spectral scans from measurements (e.g., in one or more locations across a coating substrate). The control device may determine a deviation of a parameter from an expected value on a given run, and may adjust a run parameter for a next run based on the deviation and/or based on an observed value (e.g., based on a target life for the next run and for the given run, and in accordance with a relationship between the parameter and the target life).

In some implementations, the control device may use historic information (e.g., information regarding past runs, information identifying a target life value of a target, etc.) to determine a value of one or more of the above parameters. As an example, as the target proceeds through a target life, the control device may determine to lower the rotary drive to reduce runoff. In such a case, the control device may determine the rotary drive height based on the target life. As another example, assuming that the control device is to keep the coating rate steady throughout the target life, the control device may increase the power supply setpoint based on the target life. Thus, determination of the above parameters may take into account historical information, thereby improving accuracy of the determination of the above parameters and improving coating accuracy.

As shown by reference number 140, the coating system may perform the run using the run parameters determined in connection with referenced number 130, above. In some implementations, the control device may cause the coating system to perform the run. For example, the control device may configure the coating system to perform the run using the run parameters. In some implementations, the control device may perform the run.

As shown by reference number 145, a spectrometer may perform a scan of the coated element to determine a result. For example, the spectrometer may perform one or more measurements to determine whether a parameter (e.g., coating rate, power supply setpoint, bias, rotary drive height, gas flow, spectral response, etc.) aligns with an expected value (e.g., based on a relationship between the parameter and an observed value, such as target life). In some implementations, and as shown, the spectrometer may provide information associated with the one or more measurements to the control device. In some implementations, the spectrometer may be part of the coating system. In some implementations, the spectrometer may be separate from the coating system.

As shown by reference number 150, the control device may perform reverse engineering to determine coating rate changes for target lives associated with one or more targets. More generally, the control device may perform reverse engineering to determine whether a parameter fits with a relationship between the parameter and an observed value, or to determine a drift in a parameter in relation to the observed value. For example, the control device may determine an observed coating rate for a layer. Using the observed coating rate, the control device can determine a change in the coating rate over multiple runs, which may sometimes be referred to as a coating rate slope (e.g., using a difference between a starting target life and an ending target life). The change in the coating rate may permit the control device to more accurately predict performance of a next run, thereby improving coating success rates.

In some implementations, the control device may perform enhanced reverse engineering using the historic information. For example, many runs may use multiple, different materials to perform coating. In some cases, spectral analysis of the optical element provides information that is useful for reverse engineering of all materials. For example, each material may cause a respective effect in the spectral response of the optical element. In such a case, the control device may perform reverse engineering for each material, and may store results of the reverse engineering with observed values (e.g., target life, etc.) corresponding to the results. The control device may use the results and the observed values to modify a run parameter for a future run, as described in more detail elsewhere herein. This may be referred to as unlinked reverse engineering, since the reverse engineering result for one material is not dependent on the reverse engineering result for another material.

In some aspects, the control device may performed linked reverse engineering. Linked reverse engineering may be used when measurement of an optical element is not useful for reverse engineering of all materials. For example, one or more materials may not cause an effect in the spectral response, so measurement of the spectral response may only provide information regarding other materials of the optical element. In such a case, a link between a first reverse engineering result for a first material and a second reverse engineering result for a second material may be assumed. In some cases, this link has been assumed to be 1:1, meaning that a parameter drift of X for a first material corresponds to a parameter drift of X for a second material. However, in some cases, different materials may be associated with different parameter drift. For example, a first material may be associated with a first relationship between target life and coating thickness, and a second material may be associated with a different second relationship between target life and coating thickness. In this case, it can be seen that a 1:1 link between reverse engineering results for the first material and the second material would cause increasing inaccuracy over the target life.

The control device may perform enhanced reverse engineering based on the historical information associated with the first sample and the second sample. For example, assume that a first material is associated with a relationship between coating rate and target life defined by X, and assume that a second material is associated with a relationship between coating rate and target life defined by Y. Further, assume that spectral measurement provides useful information about the first material and not the second material. In that case, the control device may perform linked reverse engineering using a link of, for example, X:Y. Thus, accuracy of reverse engineering for the first material and the second material is improved based on the historical information (e.g., based on forward parameter correction), which improves yield and reduces or eliminates the need for calibration runs. It can be seen that the above procedure can be generalized for any number of materials, links, and/or targets.

In this way, accuracy of the coating procedure is improved by enabling the maintenance of a desired value, which enables more accurate deposition of layers to conform with layer thickness goals. Furthermore, some implementations described herein may enable more consistent leapfrogging, since the relationship between a parameter and an observed value can be used to accurately determine run parameters for a run that does not immediately follow the run for which the reverse engineering is performed. Still further, some implementations described herein may improve spectral shape degradation that can be seen over multiple runs for filters that use multiple processes with different changes in coating rates. For example, since the rate correction is specific to each process or target, some implementations described herein may more accurately represent the actual coating rates for the multiple processes or targets than a linked coating rate determination technique. Even further, some implementations described herein may improve the consistency of the coating procedure across a campaign. For example, the decrease in coating rate as the target is depleted may be offset by increased deposition times based on the target life, thereby improving consistency of the coating thickness across the campaign.

As indicated above, FIG. 1 is provided merely as an example. Other examples are possible and may differ from what was described with regard to FIG. 1.

Figure 2A:
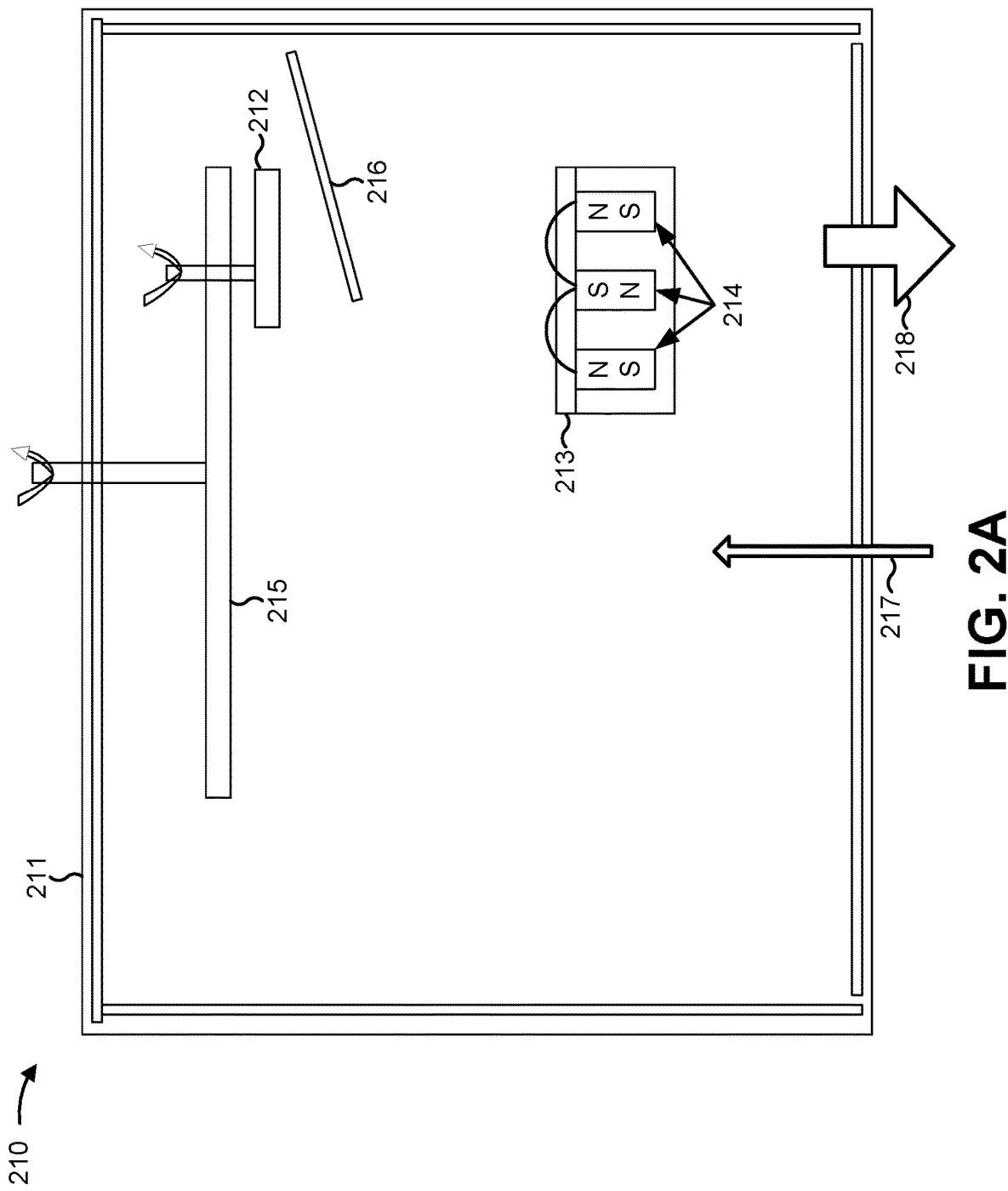
FIG. 2A is a diagram of an example coating system.

FIG. 2A is a diagram of an example coating system 210. As shown, coating system 210 includes a process chamber 211, a substrate 212, a target 213, magnets 214, a rotary motion system 215, a uniformity mask 216, a process gas intake 217, and a process chamber evacuator 218.

The coating process may occur in the process chamber 211. For example, a material may be sputtered from the target 213 onto the substrate 212. To accomplish this, a voltage is applied to target 213 (e.g., at a particular power supply setpoint or power setpoint), which may cause a plasma-based effect at a surface of the target 213. The plasma-based effect may cause the material of the target 213 to be sputtered toward the substrate 212. As the target is depleted, material may be lost from the surface of the target 213 opposite the magnets 214. That increases the distance between the surface of target 213 and substrate 212, typically reducing the coating rate. It also changes the magnetic field strength at the surface of the target 213, affecting the plasma formation process. Thus, a coating rate may change (e.g., decrease or increase, decrease then increase, increase then decrease, fluctuate, etc.) as the target life of the target 213 elapses. The rotary motion system 215 may be associated with a rotary drive height, which may place the substrate 212 closer to or farther from the target 213, thereby affecting coating rate. Gas may enter the process chamber 211 at the process gas intake 217, and may leave the process chamber 211 at the process chamber evacuator 218. In some implementations, the coating system 210 may include a spectrometer and/or the like (not shown) to perform measurements for determination of observed coating rates or other parameters.

As indicated above, FIG. 2A is provided as an example. Other examples are possible and may differ from what was described with regard to FIG. 2A.

Figure 2B:
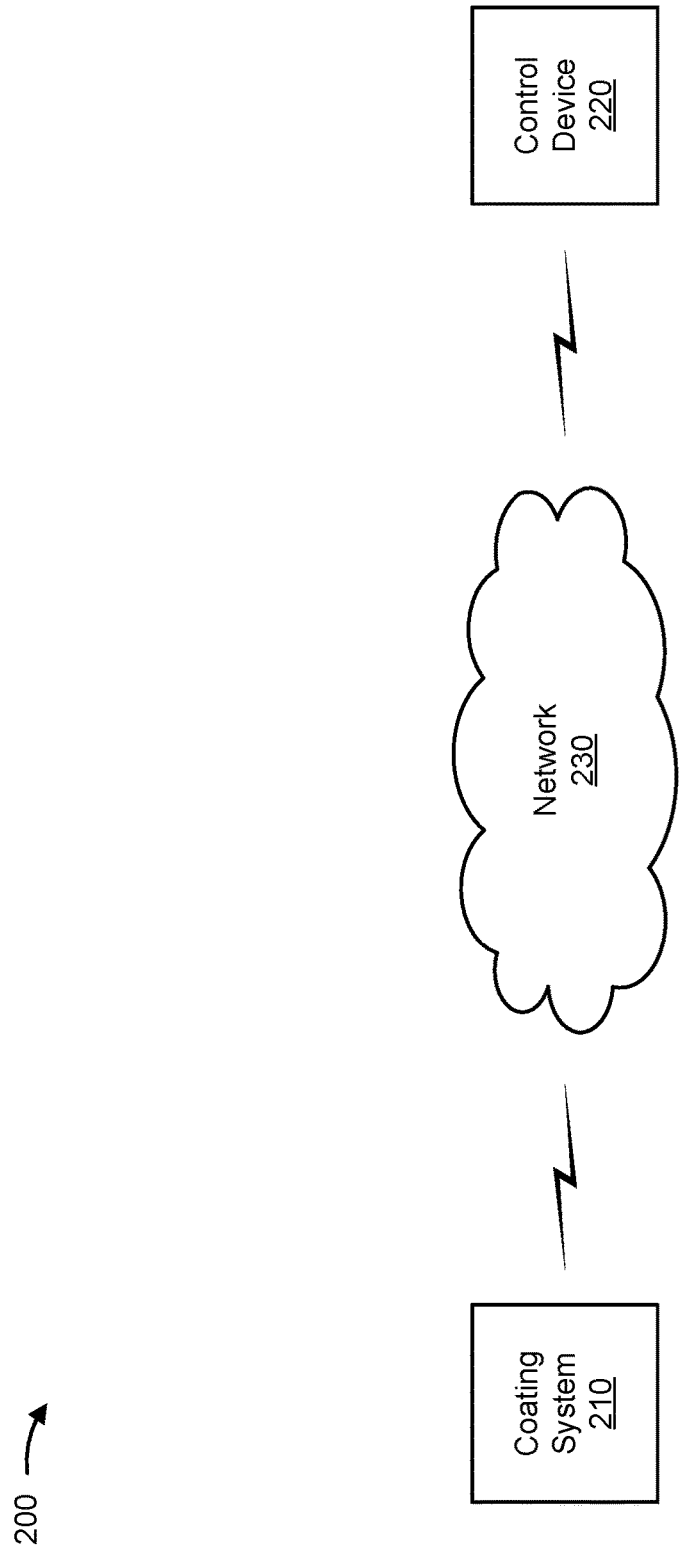
FIG. 2B is a diagram of an example environment in which systems and/or methods described herein may be implemented.

FIG. 2B is a diagram of an example environment 200 in which systems and/or methods described herein may be implemented. As shown in FIG. 2B, environment 200 may include a coating system 210, a control device 220, and a network 230. Devices of environment 200 may interconnect via wired connections, wireless connections, or a combination of wired and wireless connections.

Coating system 210 is described in more detail in connection with FIG. 2A, above.

Control device 220 includes one or more devices capable of receiving, storing, generating, processing, and/or providing information associated with controlling or configuring coating system 210. For example, control device 220 may include a server, a computer, a wearable device, a cloud computing device, and/or the like. In some implementations, control device 220 may receive information from and/or provide information to one or more other devices of environment 200, such as coating system 210.

Network 230 includes one or more wired and/or wireless networks. For example, network 230 may include a cellular network (e.g., a long-term evolution (LTE) network, a code division multiple access (CDMA) network, a 3G network, a 4G network, a 5G network, another type of next generation network, etc.), a public land mobile network (PLMN), a local area network (LAN), a wide area network (WAN), a metropolitan area network (MAN), a telephone network (e.g., the Public Switched Telephone Network (PSTN)), a private network, an ad hoc network, an intranet, the Internet, a fiber optic-based network, a cloud computing network, or the like, and/or a combination of these or other types of networks.

The number and arrangement of devices and networks shown in FIG. 2B are provided as an example. In practice, there may be additional devices and/or networks, fewer devices and/or networks, different devices and/or networks, or differently arranged devices and/or networks than those shown in FIG. 2B. Furthermore, two or more devices shown in FIG. 2B may be implemented within a single device, or a single device shown in FIG. 2B may be implemented as multiple, distributed devices. Additionally, or alternatively, a set of devices (e.g., one or more devices) of environment 200 may perform one or more functions described as being performed by another set of devices of environment 200.

Figure 3:
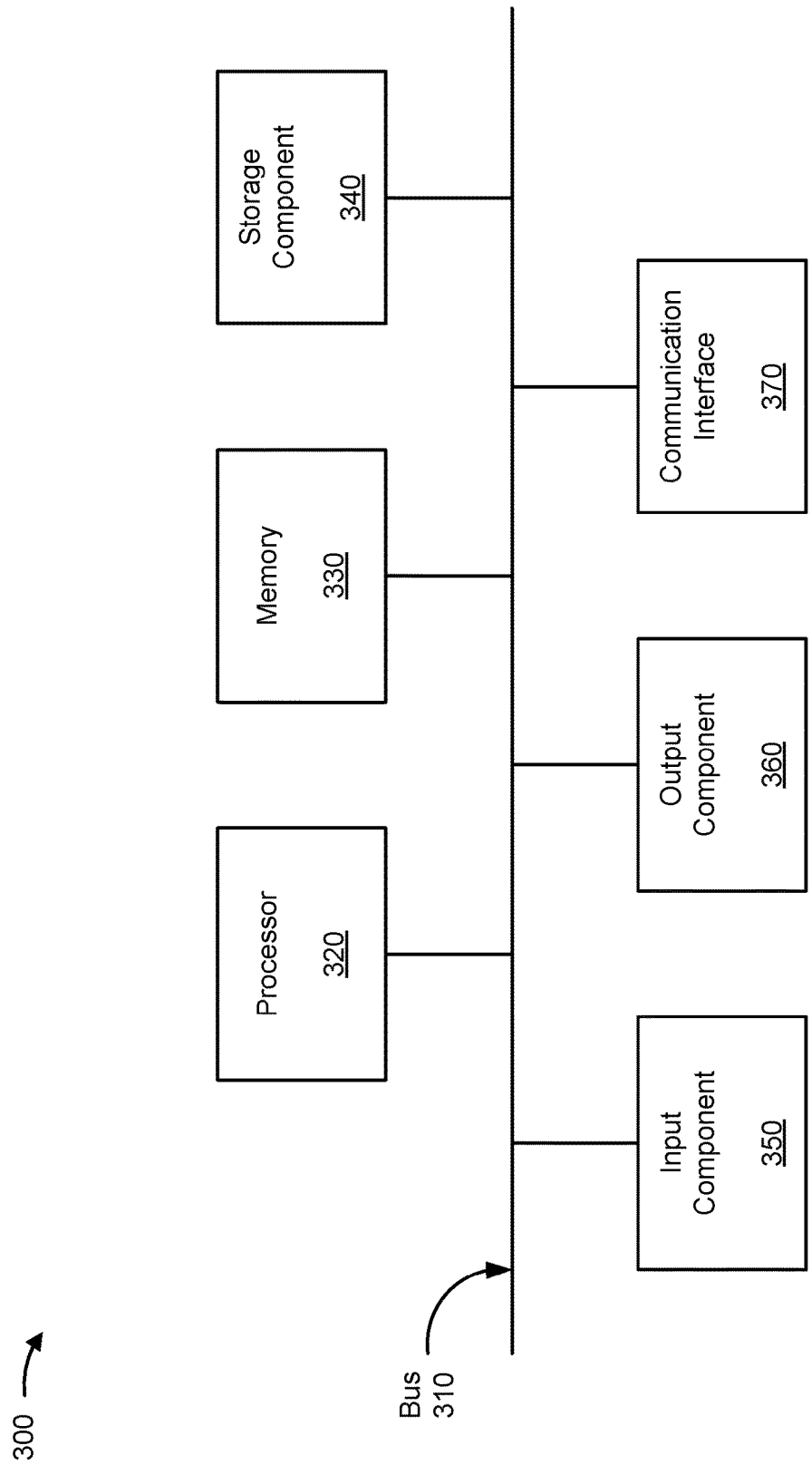
FIG. 3 is a diagram of example components of one or more devices of FIGS. 2A and 2B.

FIG. 3 is a diagram of example components of a device 300. Device 300 may correspond to coating system 210 and/or control device 220. In some implementations, coating system 210 and/or control device 220 may include one or more devices 300 and/or one or more components of device 300. As shown in FIG. 3, device 300 may include a bus 310, a processor 320, a memory 330, a storage component 340, an input component 350, an output component 360, and a communication interface 370.

Bus 310 includes a component that permits communication among the components of device 300. Processor 320 is implemented in hardware, firmware, or a combination of hardware and software. Processor 320 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 320 includes one or more processors capable of being programmed to perform a function. Memory 330 includes one or more memories, such as a random access memory (RAM), a read only memory (ROM), and/or another type of dynamic or static storage device (e.g., a flash memory, a magnetic memory, and/or an optical memory) that stores information and/or instructions for use by processor 320.

Storage component 340 stores information and/or software related to the operation and use of device 300. For example, storage component 340 may include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive.

Input component 350 includes a component that permits device 300 to receive information, such as via user input (e.g., a touch screen display, a keyboard, a keypad, a mouse, a button, a switch, and/or a microphone). Additionally, or alternatively, input component 350 may include a sensor for sensing information (e.g., a global positioning system (GPS) component, an accelerometer, a gyroscope, and/or an actuator). Output component 360 includes a component that provides output information from device 300 (e.g., a display, a speaker, and/or one or more light-emitting diodes (LEDs)).

Communication interface 370 includes a transceiver-like component (e.g., a transceiver and/or a separate receiver and transmitter) that enables device 300 to communicate with other devices, such as via a wired connection, a wireless connection, or a combination of wired and wireless connections. Communication interface 370 may permit device 300 to receive information from another device and/or provide information to another device. For example, communication interface 370 may include an Ethernet interface, an optical interface, a coaxial interface, an infrared interface, a radio frequency (RF) interface, a universal serial bus (USB) interface, a Wi-Fi interface, a cellular network interface, or the like.

Device 300 may perform one or more processes described herein. Device 300 may perform these processes based on processor 320 executing software instructions stored by a non-transitory computer-readable medium, such as memory 330 and/or storage component 340. A computer-readable medium is defined herein as a non-transitory memory device. A memory device includes memory space within a single physical storage device or memory space spread across multiple physical storage devices.

Software instructions may be read into memory 330 and/or storage component 340 from another computer-readable medium or from another device via communication interface 370. When executed, software instructions stored in memory 330 and/or storage component 340 may cause processor 320 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 3 are provided as an example. In practice, device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

Figure 4A:
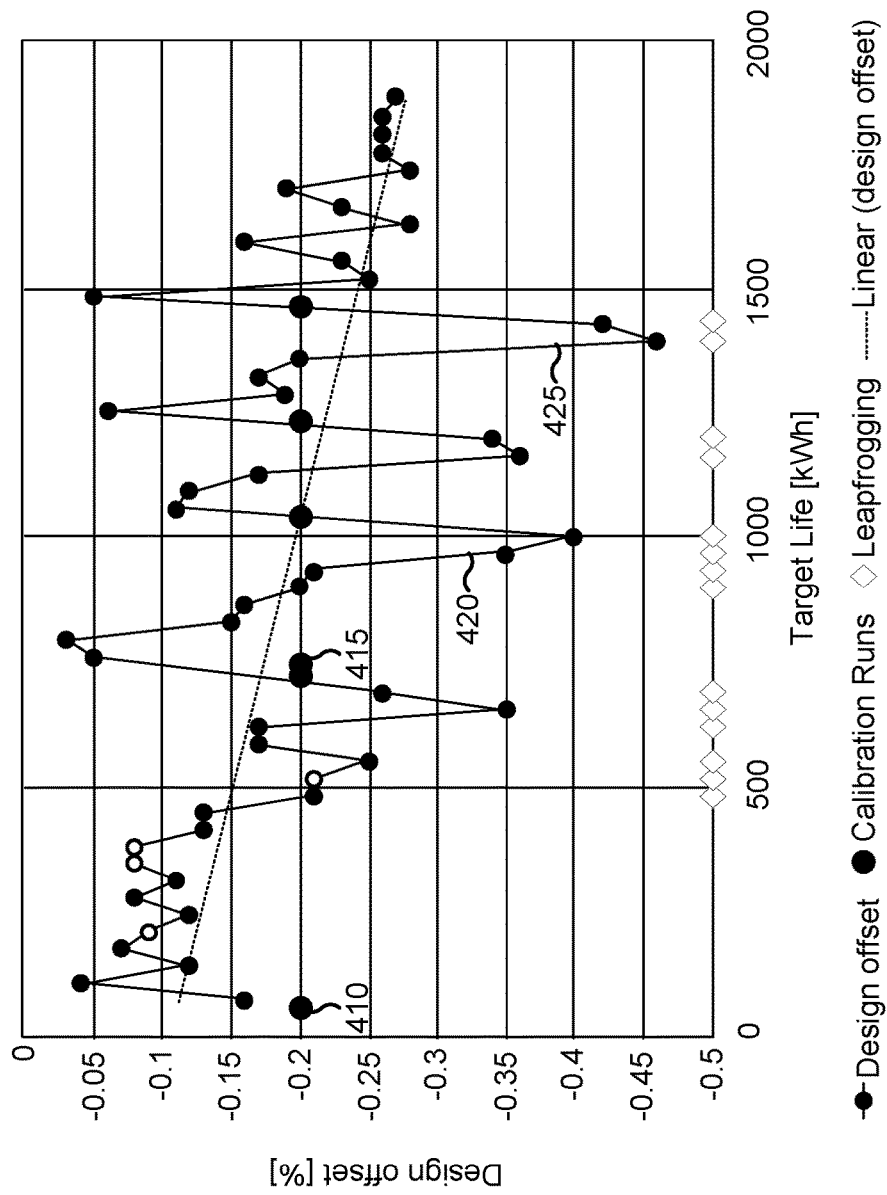
FIG. 4A is a chart of example outcomes of a coating process without forward parameter correction and enhanced reverse engineering based on expected deterministic process parameter drifts.

FIG. 4A is a chart of example outcomes 405 of a coating campaign that may not use forward parameter correction and enhanced reverse engineering based on expected deterministic process parameter drifts. In FIG. 4A, calibration runs are indicated by larger black dots, such as those shown by reference numbers 410 and 415. The vertical axis shows the spectral offset of each coating run (e.g., design offset). The horizontal axis shows the target life, expressed as kWh. For example, at 0 kWh, the target is new, and at 2000 kWh, the target is to be replaced. It is desirable to have spectral offsets that are constant throughout the target life. Ideally, the offset is consistently zero.

As can be seen, there is a negative trend in the spectral offset. This may be a result of the change in the coating rate over time that is described in connection with FIG. 1, above. Furthermore, some runs have particularly deviant outcomes—examples of these runs are shown by reference numbers 420 and 425. Note that the runs with the most negative spectral offsets coincide with leapfrogging runs (shown by the diamonds at the bottom of the graph). This is because, when using a legacy approach, the inaccuracy in coating rate over the target life is exacerbated when reverse-engineering measurements are performed for non-consecutive runs. Thus, leapfrogging may not be possible or beneficial when using the legacy approach. Furthermore, many calibration runs are performed (as shown by the larger black dots), which is resource-intensive and interrupts the campaign.

Figure 4B:
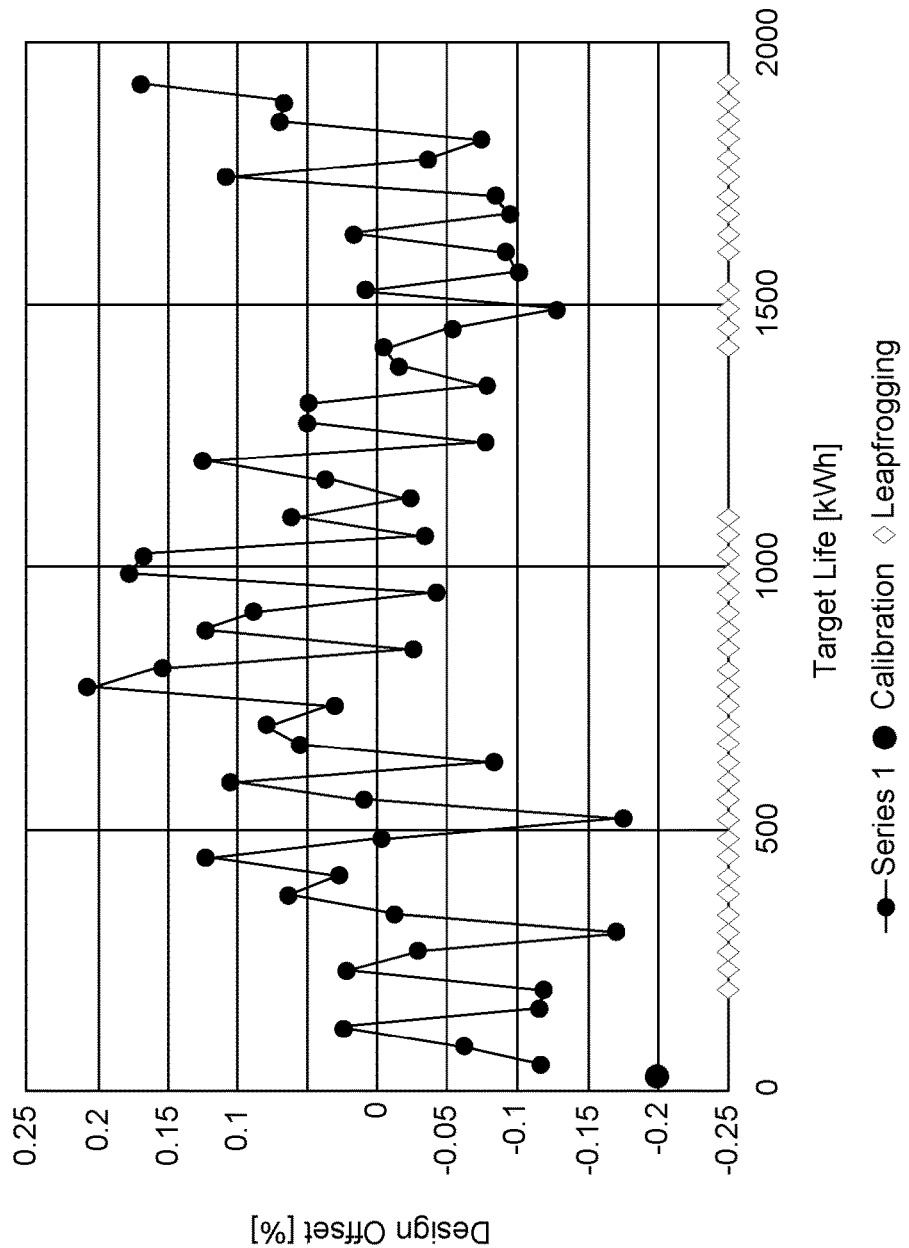
FIG. 4B is a chart of example outcomes of a coating process using forward parameter correction and enhanced reverse engineering based on expected deterministic process parameter drifts.

FIG. 4B is a chart of example outcomes 430 of a coating process using forward parameter correction and enhanced reverse engineering based on expected deterministic process parameter drifts (e.g., using the techniques described herein). As shown, the spectral offset does not significantly drift up or down during the campaign, remaining between −0.2 and approximately +0.2. This means that fewer filters are likely to violate specifications for desired values, thereby improving yield. Furthermore, since leapfrogging does not correlate with a significant drop in coating rate accuracy when using techniques described herein, leapfrogging can be performed more often than for the campaign in FIG. 4A, thereby improving throughput. Still further, only a single calibration run is performed (e.g., a first run), thereby further improving throughput.

As indicated above, FIGS. 4A and 4B are provided merely as examples. Other examples are possible and may differ from what was described with regard to FIGS. 4A and 4B.

FIG. 5 is a flow chart of an example process 500 for coating control using forward parameter correction and enhanced reverse engineering based on expected deterministic process parameter drifts. In some implementations, one or more process blocks of FIG. 5 may be performed by a control device (e.g., control device 220). In some implementations, one or more process blocks of FIG. 5 may be performed by another device or a group of devices separate from or including the control device, such as a coating system (e.g., coating system 210).

As shown in FIG. 5, process 500 may include receiving design information, wherein the design information identifies desired values for a set of layers of an optical element to be generated during one or more runs (block 510). For example, the control device (e.g., using processor 320, communication interface 370, etc.) may receive design information (e.g., as shown by reference number 120 of FIG. 1). The design information may identify one or more desired values for a set of layers of an optical element. For example, the optical element may include a filter and/or another optical element. The optical element may be generated during the one or more runs.

As further shown in FIG. 5, process 500 may include receiving or obtaining historic information identifying a relationship between a parameter for the one or more runs and an observed value relating to the one or more runs or the optical element (block 520). For example, the control device (e.g., using processor 320, communication interface 370, etc.) may receive or obtain (e.g., determine) historic information (e.g., as shown by reference number 110 of FIG. 1). The historic information may identify a relationship between a parameter and an observed value for the one or more runs. In various examples described herein, the parameter may include a coating rate, a rotary drive height, a supply power setpoint, a gas flow rate, and/or the like. In various examples described herein, the observed value may include a target life, a spectral response, a refractive index, a coating rate, an absorption index, and/or the like. In some implementations, the historic information may be based on a previous campaign. In some implementations, the historic information may be based on a previous run of a current campaign. For example, the historic information may be based on a reverse engineering result for the current campaign. In some implementations, the historic information may identify multiple relationships (e.g., for multiple different processes, for multiple measurements on different parts of an optical element, etc.), which may be used to improve accuracy of reverse engineering.

Implementations described herein use desired values, parameters, observed values, and run parameters. A run parameter (shown by reference number 135 of FIG. 1) may include a value used to perform a run that can be adjusted based on a historical value and/or a result of reverse engineering. A desired value may be identified by design information (shown by reference number 120 of FIG. 1) and may identify a target thickness (e.g., a targeted thickness associated with the run), coating rate, spectral response, and/or the like. A parameter may include a value that has a relationship to an observed value that can be described (e.g., using a linear or non-linear polynomial). The relationship between the parameter and the observed value can be used to predict values of the parameter in different conditions (e.g., at different points in the observed value's lifespan, for different spectral measurements, and/or the like).

As further shown in FIG. 5, process 500 may include determining layer information for the one or more runs based on the historic information, wherein the layer information identifies run parameters, for the set of layers, to achieve the desired values (block 530). For example, the control device (e.g., using processor 320, communication interface 370, etc.) may determine layer information, shown by reference number 135 of FIG. 1. The layer information may identify run parameters that the control device has determined based on the design information, the historic information, and/or a reverse engineering result. For example, the run parameters may include gas flow rate, power supply setpoint, run time, rotary drive height, and/or the like. In some implementations, the layer information may identify run parameters for a next run. In some implementations, the layer information may identify run parameters for a next N runs (N>1). In such a case, the control device may modify one or more run parameters of a future run based on performing reverse engineering of a past or current run, as described in more detail elsewhere herein.

As further shown in FIG. 5, process 500 may include causing the one or more runs to be performed based on the layer information (block 540). For example, the control device (e.g., using processor 320, communication interface 370, etc.) may cause the one or more runs to be performed using the layer information (e.g., the run parameters), as shown by reference number 140 of FIG. 1. In some implementations, the control device may perform the one or more runs. In some implementations, the control device may cause the coating system to perform the one or more runs.

As further shown in FIG. 5, process 500 may include determining information identifying a result of the one or more runs, wherein the information identifying the result identifies a value of the observed value for the one or more runs (block 550). For example, the control device (e.g., using processor 320, communication interface 370, etc.) may determine information identifying a result of the one or more runs, as shown by reference numbers 145 and 150. For example, the control device, or another device (e.g., a spectrometer and/or the like) may determine a measurement or spectral response for the optical element. The measurement or spectral response may indicate a result of the one or more runs (e.g., a layer thickness, a spectral characteristic, a filter frequency, a runoff level, and/or the like). The control device may determine whether the result deviates from a desired value and/or from a value predicted using the historic information (e.g., as shown by reference number 150). Furthermore, the result may indicate a value of the observed value (e.g., the target life, refraction index, absorption, etc.), which the control device may use to modify a run parameter, as described in more detail below. This process block may be referred to, in some cases, as enhanced reverse engineering.

As further shown in FIG. 5, process 500 may include modifying a run parameter, of the run parameters, based on the information identifying the result (block 560). For example, the control device (e.g., using processor 320, communication interface 370, etc.) may modify a run parameter (shown by reference number 130) based on the information identifying the result. In some implementations, the control device may determine a run parameter for a future run based on the information identifying the result. In some implementations, the control device may modify the run parameter based on the historic information, the design information, and/or the information identifying the result. In this way, the control device may dynamically adapt the run parameters based on a combination of enhanced reverse engineering and forward parameter correction, which improves campaign accuracy and reduces reliance on costly calibration runs.

Process 500 may include additional implementations, such as any single implementation or any combination of implementations described below and/or in connection with one or more other processes described elsewhere herein.

In some implementations, the control device may determine information identifying a result of the one or more runs, wherein the information identifying the result identifies a value of the observed value for the one or more runs; and modify a run parameter, of the run parameters, based on the information identifying the result. In some implementations, the historic information includes at least part of the information identifying the result. In some implementations, the information identifying the result is based on a spectral measurement of the optical element. In some implementations, the information identifying the result is based on a plurality of spectral measurements of the optical element. In some implementations, wherein the one or more runs use a plurality of materials, and wherein the historic information identifies respective relationships for the plurality of materials. In some implementations, the plurality of materials is associated with a single target. In some implementations, the control device may determine the information identifying the result based on at least two relationships of the plurality of relationships.

In some implementations, the relationship identifies a rate of change of the parameter in comparison to the observed value. In some implementations, the parameter is a coating rate and the observed value is a target life. In some implementations, the run parameter includes at least one of a gas flow rate, a supply power configuration, a supply power setpoint, or a rotary drive height.

In some implementations, the parameter is a rotary drive height and the observed value is a target life or a runoff value. In some implementations, the parameter is a supply power setpoint and the observed value is a target life. In some implementations, the parameter is a gas flow rate and the observed value is a refractive index or an absorption index. In some implementations, the historic information is for a first run, wherein the layer information is for a second run, and wherein the first run and the second run are separated by at least one run. In some implementations, the desired value includes at least one of a thickness of a layer of the set of layers, a refractive index of the optical element, or an absorption index. In some implementations, the one or more runs are part of a coating campaign to generate the optical element using a sputtering technique.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

In this way, control device 220 improves accuracy of the deposition process is improved by enabling the maintenance of a desired value and/or a stable coating chamber. Furthermore, control device 220 may enable more consistent leap-frogging, since the relationship between the parameter and the observed value can be used to accurately determine run parameters for a run that does not immediately follow the run in which reverse engineering is performed. Still further, control device 220 may improve spectral shape degradation that can be seen over multiple runs for filters that use multiple processes or targets with different coating rate slopes. For example, since the rate correction can be specific to each process or target when using enhanced reverse engineering, control device 220 may more accurately determine the actual coating rates for the multiple processes or targets than a linked coating rate determination technique that assumes a constant or 1:1 relationship. Even further, control device 220 may improve the consistency of the coating chamber across a campaign. For example, the decrease in coating rate as the target is depleted may be offset by increased run times based on the target life, thereby improving consistency of the coating rate across the campaign.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, or a combination of hardware and software.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, or the like.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A control device configured to control sputtering of a coating system, comprising:
    one or more memories; and
    one or more processors, communicatively coupled to the one or more memories, programmed to:
        receive design information, wherein the design information identifies desired values for a set of layers of an optical element to be generated during one or more runs;
        receive or obtain historic information that indicates a drift of a coating rate over a target life for a single target;
        determine layer information for the one or more runs based on the historic information,
            wherein the layer information identifies run parameters, for the set of layers, to achieve the desired values;
        cause the coating system to perform the sputtering based on the layer information;
        determine information identifying a result of the one or more runs,
            wherein the information identifying the result is based on at least one spectral measurement of the optical element, and
            wherein the information identifying the result indicates one or more of a layer thickness, a spectral characteristic, a filter frequency, a runoff level, a refraction index, or an absorption;
        modify, to keep one or more future runs accurate with regard to a desired value of the desired values, a run parameter, of the run parameters, based on whether the result deviates from the desired value,
            wherein the run parameter is one of a run time for the set of layers, a gas flow rate, a supply power configuration, a supply power setpoint, or a geometric configuration; and
        cause the coating system to perform additional sputtering based on the modified run parameter.

2. The control device of claim 1, wherein the at least one spectral measurement includes a plurality of spectral measurements of the optical element.

3. The control device of claim 1, wherein the one or more runs use a plurality of materials.

4. The control device of claim 3, wherein the plurality of materials is associated with the single target.

5. The control device of claim 3, wherein the one or more processors, when determining the information identifying the result of the one or more runs, are further to:
    determine the information identifying the result based on rates of change of coating rates for the plurality of materials.

6. A method for controlling sputtering of a coating system, comprising;
    receiving, by a coating control device, design information, wherein the design information identifies desired values for a set of layers of an optical element to be generated during one or more runs;
    receiving or obtaining, by the coating control device, historic information that indicates a drift of a coating rate over a target life for a single target;
    determining, by the coating control device, layer information for the one or more runs based on the historic information,
        wherein the layer information identifies run parameters, for the set of layers, to achieve the desired values;
    causing, by the coating control device, the coating system to perform the sputtering based on the layer information;
    determining, by the coating control device, information identifying a result of the one or more runs,
        wherein the information identifying the result is based on at least one spectral measurement of the optical element, and
        wherein the information identifying the result indicates one or more of a layer thickness, a spectral characteristic, a filter frequency, a runoff level, a refraction index, or an absorption; and
    modifying, by the coating control device and to keep one or more future runs accurate with regard to a desired value of the desired values, a run parameter, of the run parameters, based on whether the result deviates from the desired value,
        wherein the run parameter is one of a run time for the set of layers, a gas flow rate, a supply power configuration, a supply power setpoint, or a geometric configuration; and
    causing, by the coating control device, the coating system to perform additional sputtering based on the modified run parameter.

7. The method of claim 6, wherein the one or more runs use a plurality of materials.

8. The method of claim 6, wherein the run parameter is the geometric configuration.

9. The method of claim 6, wherein the run parameter is the supply power setpoint.

10. The method of claim 6, wherein the run parameter is the gas flow rate.

11. The control device of claim 1, wherein the historic information is for a first run, wherein the layer information is for a second run, wherein the second run is the one or more runs, and wherein the first run and the second run are separated by at least one run.

12. The control device of claim 1, wherein the desired values identify a thickness of a layer of the set of layers.

13. The control device of claim 1, wherein the run parameter is the geometric configuration.

14. The control device of claim 1, wherein the run parameter is the supply power setpoint.

15. The control device of claim 1, wherein the run parameter is the gas flow rate.

16. The control device of claim 1, wherein the run parameter is the run time for the set of layers.

* * * * *